(12) United States Patent
Li et al.

(10) Patent No.: US 12,255,173 B2
(45) Date of Patent: Mar. 18, 2025

(54) CHIP PACKAGE STRUCTURE

(71) Applicant: Taiwan Semiconductor Manufacturing Company, Ltd., Hsinchu (TW)

(72) Inventors: Ling-Wei Li, Hsinchu (TW); Jung-Hua Chang, Hsinchu (TW); Cheng-Lin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/518,790

(22) Filed: Nov. 24, 2023

(65) Prior Publication Data

US 2024/0088090 A1 Mar. 14, 2024

Related U.S. Application Data

(63) Continuation of application No. 17/884,200, filed on Aug. 9, 2022, now Pat. No. 11,855,039, which is a
(Continued)

(51) Int. Cl.
*H01L 23/00* (2006.01)
*H01L 21/48* (2006.01)
(Continued)

(52) U.S. Cl.
CPC .......... *H01L 24/81* (2013.01); *H01L 21/4853* (2013.01); *H01L 21/486* (2013.01); *H01L 21/563* (2013.01); *H01L 21/565* (2013.01); *H01L 21/76816* (2013.01); *H01L 21/76871* (2013.01); *H01L 23/3128* (2013.01); *H01L 23/3135* (2013.01); *H01L 23/4824* (2013.01); *H01L 23/49827* (2013.01); *H01L 23/5226* (2013.01); *H01L 23/562* (2013.01); *H01L 24/09* (2013.01); *H01L 24/11* (2013.01); *H01L 24/16* (2013.01); *H01L 24/17* (2013.01);
(Continued)

(58) Field of Classification Search
None
See application file for complete search history.

(56) References Cited

U.S. PATENT DOCUMENTS 6,339,197 B1   1/2002   Fushie et al.
11,456,276 B2  7/2022   Li et al.
(Continued)

*Primary Examiner* — Feifei Yeung Lopez
(74) *Attorney, Agent, or Firm* — Birch, Stewart, Kolasch & Birch, LLP

(57) ABSTRACT

A chip package structure is provided. The chip package structure includes a first substrate. The chip package structure includes a conductive via structure passing through the first substrate. The chip package structure includes a barrier layer over a surface of the first substrate. The chip package structure includes an insulating layer over the barrier layer. The chip package structure includes a conductive pad over the insulating layer. The conductive pad has a first portion passing through the insulating layer and the barrier layer and connected to the conductive via structure. The chip package structure includes a conductive bump over the conductive pad. The chip package structure includes a second substrate. The chip package structure includes an underfill layer between the first substrate and the second substrate.

20 Claims, 16 Drawing Sheets

Related U.S. Application Data continuation of application No. 16/995,183, filed on Aug. 17, 2020, now Pat. No. 11,456,276, which is a continuation of application No. 16/454,435, filed on Jun. 27, 2019, now Pat. No. 10,770,427.

(51) Int. Cl.
  *H01L 21/56* (2006.01)
  *H01L 21/768* (2006.01)
  *H01L 23/31* (2006.01)
  *H01L 23/482* (2006.01)
  *H01L 23/498* (2006.01)
  *H01L 23/522* (2006.01)

(52) U.S. Cl.
  CPC ............ *H01L 2224/02333* (2013.01); *H01L 2224/03914* (2013.01); *H01L 2224/04* (2013.01); *H01L 2224/0401* (2013.01); *H01L 2224/16227* (2013.01); *H01L 2924/18161* (2013.01); *H01L 2924/351* (2013.01)

(56) References Cited

U.S. PATENT DOCUMENTS

| | | |
|---|---|---|
| 2002/0151164 A1 | 10/2002 | Jiang et al. |
| 2003/0109079 A1 | 6/2003 | Yamaguchi et al. |
| 2010/0133704 A1* | 6/2010 | Marimuthu ......... H01L 23/3128 257/E23.116 |
| 2011/0068466 A1* | 3/2011 | Chen ................ H01L 21/76898 257/737 |
| 2017/0053882 A1 | 2/2017 | Jin et al. |

* cited by examiner

CHIP PACKAGE STRUCTURE

CROSS REFERENCE

This application is a Continuation of U.S. application Ser. No. 17/884,200, filed on Aug. 9, 2022, which is a Continuation of U.S. application Ser. No. 16/995,183, filed on Aug. 17, 2020, which is a Continuation of U.S. application Ser. No. 16/454,435, filed on Jun. 27, 2019, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or insulating layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately to form packages. Each package is bonded to a substrate. During the bonding process, the bonding stress between the package and the substrate tends to lower the yield of the bonding process. Therefore, it is a challenge to improve the yield of the bonding process.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1E-1 is a top view of the chip package structure of FIG. 1E, in accordance with some embodiments.

FIG. 1G-1 is a top view of the chip package structure of FIG. 1G, in accordance with some embodiments.

DETAILED DESCRIPTION

Figure 1A:
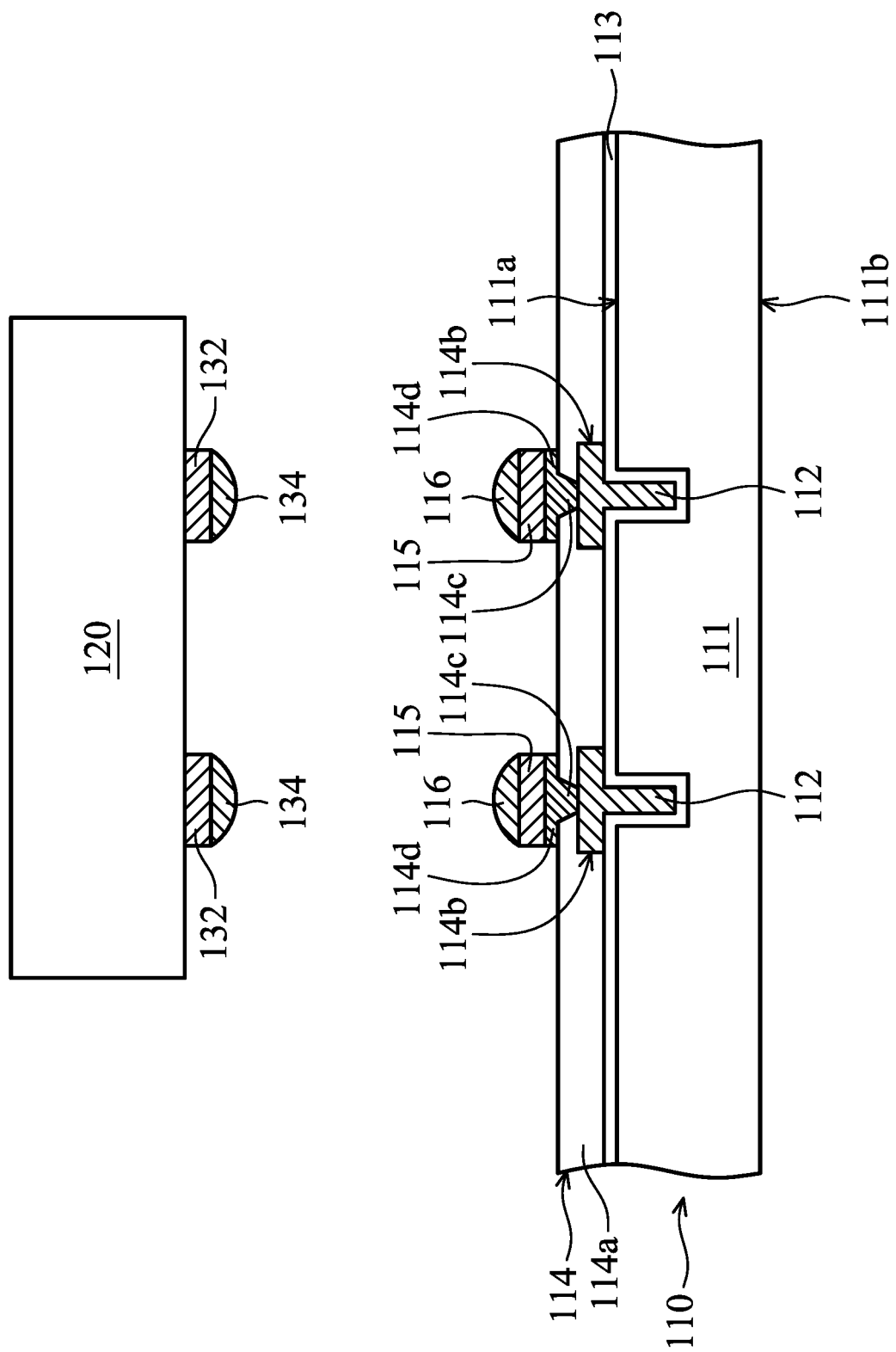
FIGS. 1A-1H are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1H are cross-sectional views of various stages of a process for forming a chip package structure, in accordance with some embodiments. As shown in FIG. 1A, a substrate 110 is provided, in accordance with some embodiments. In some embodiments, the substrate 110 is an interposer wafer. The substrate 110 includes a semiconductor substrate 111, conductive via structures 112, a barrier layer 113, and a redistribution structure 114, in accordance with some embodiments.

The semiconductor substrate 111 has surfaces 111a and 111b, in accordance with some embodiments. In some embodiments, the semiconductor substrate 111 is made of an elementary semiconductor material including silicon or germanium in a single crystal, polycrystal, or amorphous structure.

In some other embodiments, the semiconductor substrate 111 is made of a compound semiconductor (e.g., silicon carbide, gallium arsenide, gallium phosphide, indium phosphide, or indium arsenide), an alloy semiconductor (e.g., SiGe or GaAsP), or a combination thereof. The semiconductor substrate 111 may also include multi-layer semiconductors, semiconductor on insulator (SOI) (such as silicon on insulator or germanium on insulator), or a combination thereof.

The conductive via structures 112 are formed in the semiconductor substrate 111, in accordance with some embodiments. The conductive via structures 112 may be formed to extend from the surface 111a into the semiconductor substrate 111. The barrier layer 113 is formed over the semiconductor substrate 111, in accordance with some embodiments. The barrier layer 113 is between the conductive via structures 112 and the semiconductor substrate 111, in accordance with some embodiments.

The barrier layer 113 is configured to prevent the material of the conductive via structures 112 from diffusing into the semiconductor substrate 111, in accordance with some embodiments. The barrier layer 113 is further configured to electrically insulate the conductive via structures 112 from the semiconductor substrate 111, in accordance with some embodiments.

The barrier layer 113 is made of a silicon-containing material such as silicon nitride, silicon oxide, silicon oxynitride, silicon carbide, the like, or a combination thereof, in accordance with some embodiments. In some other embodiments, the barrier layer 113 is made of phosphosilicate glass (PSG), borosilicate glass (BSG), boron-doped phosphosilicate glass (BPSG), fluorine-doped silicate glass (FSG), tetraethyl orthosilicate (TEOS), or the like.

The barrier layer 113 is formed using an oxidation process, a deposition process, a spin-on coating process, or another suitable process. The deposition process includes a chemical vapor deposition (CVD) process such as a flowable chemical vapor deposition (FCVD) process, a plasma enhanced chemical vapor deposition (PECVD) process, a low pressure chemical vapor deposition (LPCVD) process, or the like, in accordance with some embodiments.

In some embodiments, the substrate 110 is a device wafer that includes various device elements. In some embodiments, the various device elements are formed in and/or over the semiconductor substrate 111. The device elements are not shown in figures for the purpose of simplicity and clarity. Examples of the various device elements include active devices, passive devices, other suitable elements, or a combination thereof. The active devices may include transistors or diodes (not shown) formed at the surface 111a. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 111. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof.

The redistribution structure 114 is formed over the semiconductor substrate 111, in accordance with some embodiments. The redistribution structure 114 includes an insulating layer 114a, wiring layers 114b, conductive vias 114c, and conductive pads 114d, in accordance with some embodiments. The insulating layer 114a is formed over the surface 111a, in accordance with some embodiments. The wiring layers 114b are formed in the insulating layer 114a, in accordance with some embodiments.

As shown in FIG. 1A, the conductive vias 114c are electrically connected between different wiring layers 114b and between the wiring layer 114b and the conductive pads 114d, in accordance with some embodiments. For the sake of simplicity, FIG. 1A only shows one of the wiring layers 114b, in accordance with some embodiments.

The conductive via structures 112 are electrically connected to the conductive pads 114d through the wiring layers 114b and the conductive vias 114c, in accordance with some embodiments. The conductive pads 114d are formed over the insulating layer 114a, in accordance with some embodiments. The conductive via structures 112, the wiring layers 114b, the conductive vias 114c, and the conductive pads 114d are made of a conductive material, such as copper (Cu), aluminum (Al), tungsten (W), cobalt (Co), nickel (Ni), or another suitable material, in accordance with some embodiments.

As shown in FIG. 1A, conductive bumps 115 are respectively formed over the conductive pads 114d, in accordance with some embodiments. The conductive bumps 115 are made of a conductive material, such as copper (Cu), aluminum (Al), tungsten (W), cobalt (Co), nickel (Ni), or another suitable material, in accordance with some embodiments. As shown in FIG. 1A, solder layers 116 are respectively formed over the conductive bumps 115, in accordance with some embodiments. The solder layers 116 are made of a conductive material, such as Tin (Sn) or another suitable material, in accordance with some embodiments.

As shown in FIG. 1A, a chip 120 is provided, in accordance with some embodiments. The chip 120 includes a system on chip (SoC), in accordance with some embodiments. The chip 120 includes various device elements, in accordance with some embodiments. In some embodiments, the various device elements are formed in the chip 120.

The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the chip 120. The isolation features are used to define active regions and electrically isolate various device elements formed in the active regions. In some embodiments, the isolation features include shallow trench isolation (STI) features, local oxidation of silicon (LOCOS) features, other suitable isolation features, or a combination thereof.

As shown in FIG. 1A, conductive bumps 132 are formed over the chip 120, in accordance with some embodiments. As shown in FIG. 1A, solder layers 134 are respectively formed over the conductive bumps 132, in accordance with some embodiments. The solder layers 134 are made of a conductive material, such as Tin (Sn) or another suitable material, in accordance with some embodiments.

Figure 1B:
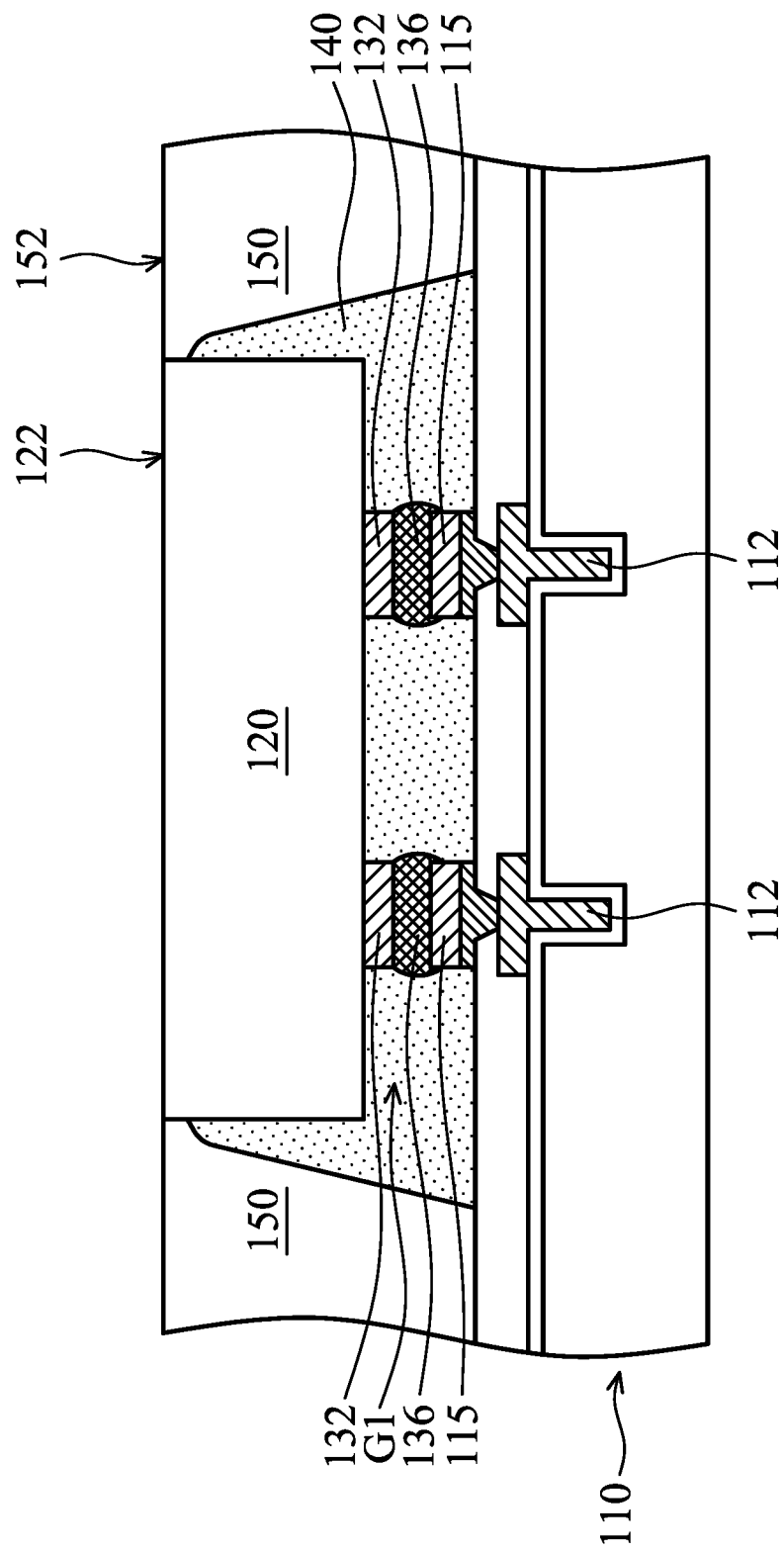

As shown in FIGS. 1A and 1B, the chip 120 is disposed over the substrate 110, in accordance with some embodiments. Thereafter, a reflow process is performed over the solder layers 134 and 116, in accordance with some embodiments. After the reflow process, each solder layer 134 and the solder layer 116 thereunder melt and mix together to form a solder ball 136, in accordance with some embodiments. Therefore, the chip 120 is bonded to the substrate 110 through the conductive bumps 132 and 115 and the solder balls 136, in accordance with some embodiments.

As shown in FIG. 1B, an underfill layer 140 is formed into a gap G1 between the substrate 110 and the chip 120, in accordance with some embodiments. The underfill layer 140 surrounds the conductive bumps 132 and 115, the solder balls 136, and the chip 120, in accordance with some embodiments. The underfill layer 140 includes a polymer material (e.g., a molding compound material, epoxy, or resin), in accordance with some embodiments.

As shown in FIG. 1B, a molding layer 150 is formed over the substrate 110, in accordance with some embodiments. The molding layer 150 surrounds the chip 120, the underfill layer 140, the conductive bumps 132 and 115, and the solder balls 136, in accordance with some embodiments. The molding layer 150 includes a polymer material (e.g., a molding compound material, epoxy, or resin), in accordance with some embodiments. The formation of the molding layer 150 includes forming a molding material layer over the substrate 110, the underfill layer 140, and the chip 120; and performing a planarization process over the molding material layer to remove an upper portion of the molding material layer until a top surface 122 of the chip 120 is exposed, in accordance with some embodiments. The top surface 122 and 152 of the chip 120 and the molding layer 150 are substantially coplanar, in accordance with some embodiments.

Figure 1C:
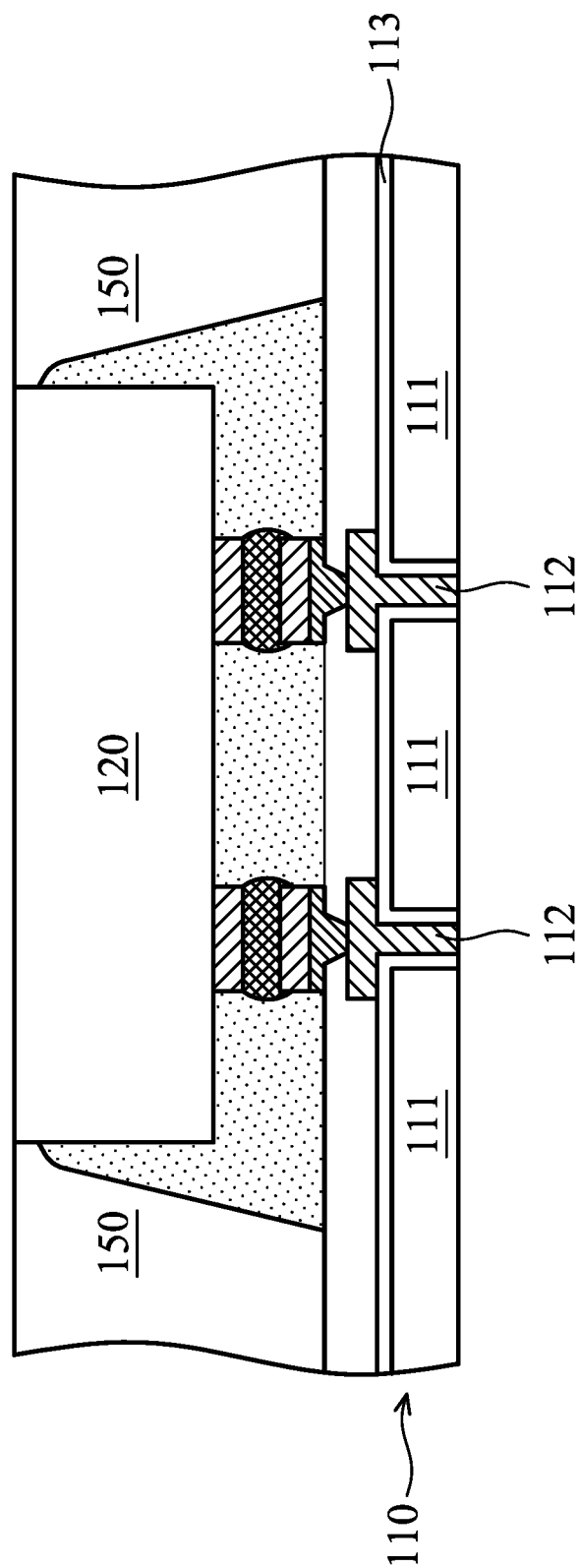

As shown in FIG. 1C, a lower portion of the semiconductor substrate 111 is removed, in accordance with some embodiments. The removal process includes a chemical mechanical polishing (CMP) process, in accordance with some embodiments. After the removal process, the conductive via structures 112 and the barrier layer 113 are exposed, in accordance with some embodiments.

The conductive via structures 112 and the barrier layer 113 pass through the semiconductor substrate 111, in accordance with some embodiments. The conductive via structures 112 are also referred to as through-substrate vias or through-silicon vias (TSV) when the semiconductor substrate 111 is a silicon substrate, in accordance with some embodiments.

Figure 1D:
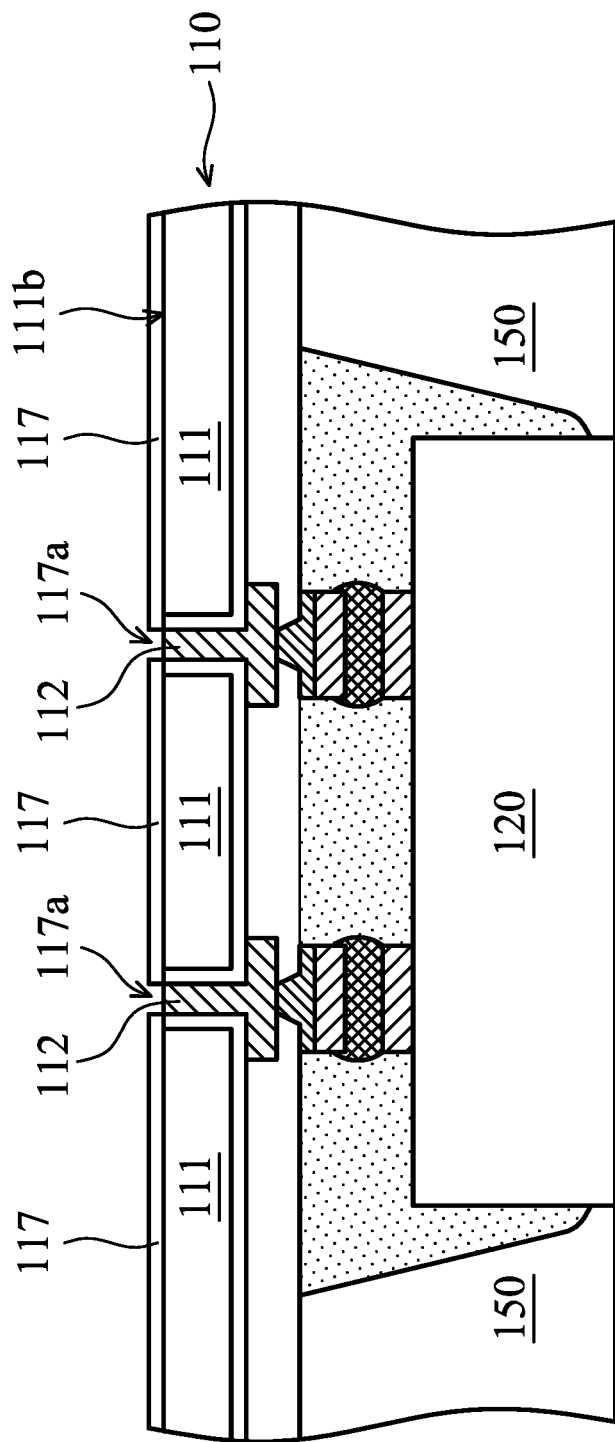

As shown in FIG. 1D, the semiconductor substrate 111 is flipped upside down, in accordance with some embodiments. As shown in FIG. 1D, a barrier layer 117 is formed over the surface 111b, in accordance with some embodiments. The barrier layer 117 is configured to prevent the material of wiring layers subsequently formed thereon from diffusing into the semiconductor substrate 111, in accordance with some embodiments. The barrier layer 117 is further configured to electrically insulate wiring layers subsequently formed thereon from the semiconductor substrate 111, in accordance with some embodiments.

The barrier layer 117 is in direct contact with the semiconductor substrate 111, in accordance with some embodiments. The barrier layer 117 has openings 117a, in accordance with some embodiments. The openings 117a respectively expose the conductive via structures 112 thereunder, in accordance with some embodiments.

The barrier layer 117 is made of a silicon-containing material such as silicon nitride, silicon oxide, silicon oxynitride, silicon carbide, the like, or a combination thereof, in accordance with some embodiments. In some other embodiments, the barrier layer 117 is made of phosphosilicate glass (PSG), borosilicate glass (BSG), boron-doped phosphosilicate glass (BPSG), fluorine-doped silicate glass (FSG), tetraethyl orthosilicate (TEOS), or the like.

The barrier layer 117 is formed using an oxidation process, a deposition process, a spin-on coating process, or another suitable process. The deposition process includes a chemical vapor deposition (CVD) process such as a flowable chemical vapor deposition (FCVD) process, a plasma enhanced chemical vapor deposition (PECVD) process, a low pressure chemical vapor deposition (LPCVD) process, or the like, in accordance with some embodiments. The openings 117a are formed using a photolithography process and an etching process, in accordance with some embodiments.

Figure 1E:
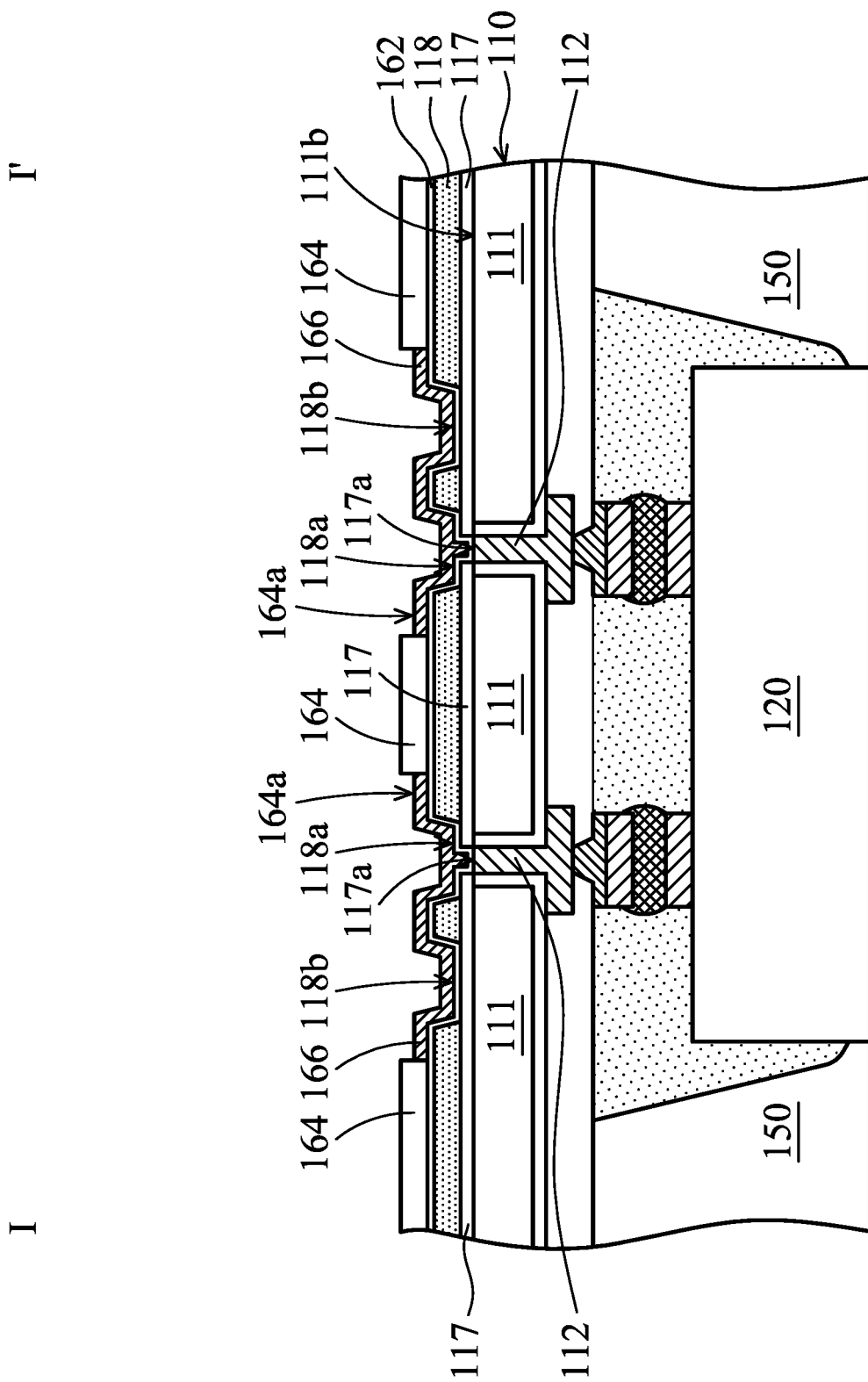
Figures 1, 1E:
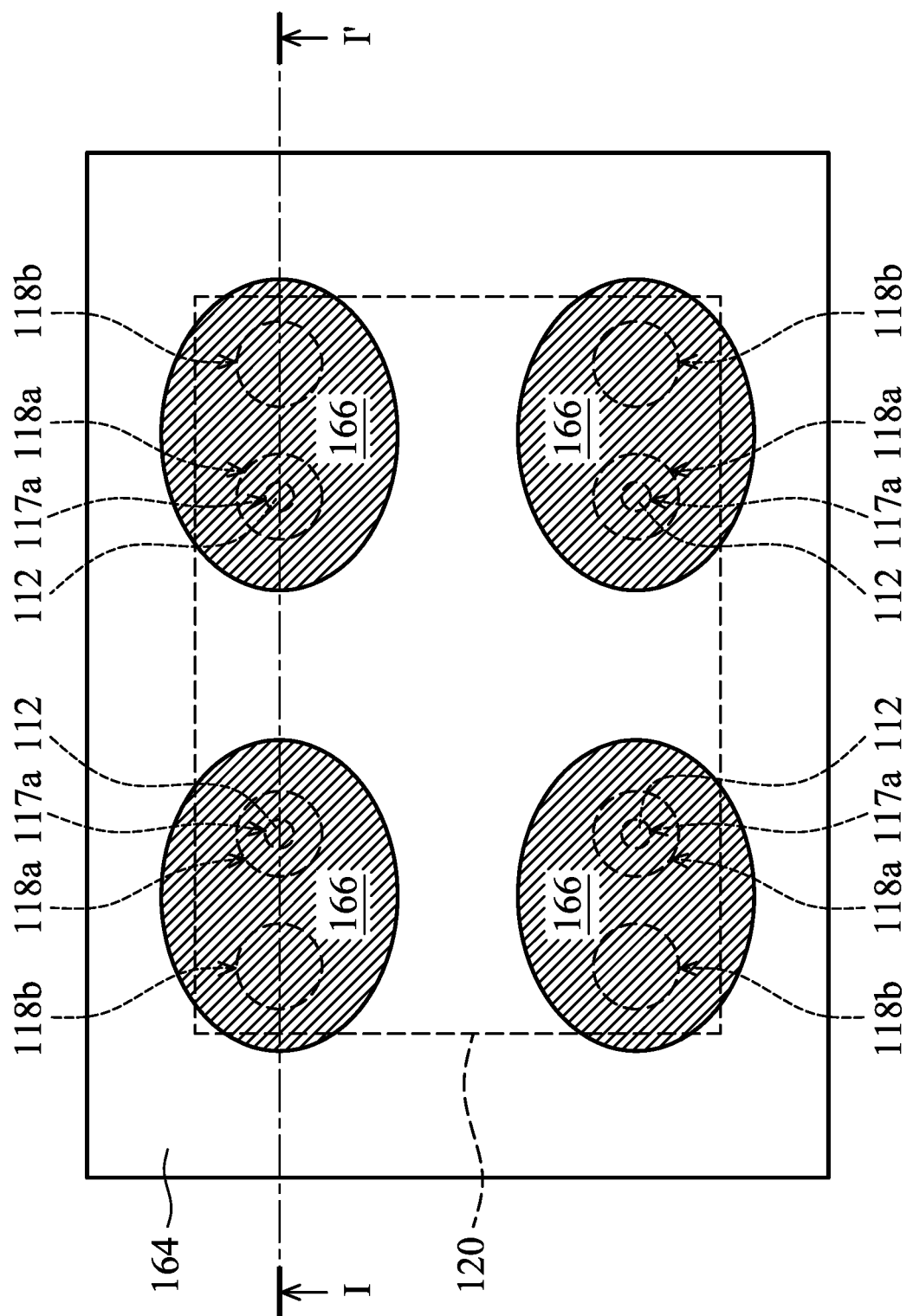

FIG. 1E-1 is a top view of the chip package structure of FIG. 1E, in accordance with some embodiments. FIG. 1E is a cross-sectional view illustrating the chip package structure along a sectional line I-I' in FIG. 1E-1, in accordance with some embodiments.

As shown in FIGS. 1E and 1E-1, an insulating layer 118 is formed over the barrier layer 117, in accordance with some embodiments. The insulating layer 118 has openings 118a and 118b, in accordance with some embodiments. The openings 118a are respectively over the openings 117a, in accordance with some embodiments.

The openings 118a respectively connect with the openings 117a thereunder, in accordance with some embodiments. The openings 118a respectively expose the conductive via structures 112 thereunder, in accordance with some embodiments. The openings 118a further expose the barrier layer 117 surrounding the conductive via structures 112, in accordance with some embodiments.

The openings 118b partially expose the barrier layer 117 close to the conductive via structures 112, in accordance with some embodiments. The insulating layer 118 is partially between the openings 118a and 118b, in accordance with some embodiments. The barrier layer 117 is thinner than the insulating layer 118, in accordance with some embodiments. The hardness of the barrier layer 117 is greater than the hardness of the insulating layer 118, in accordance with some embodiments.

The insulating layer 118 is made of a polymer material such as epoxy, polyimide, polybenzoxazole (PBO), solder resist (SR), ABF film, and the like, in accordance with some embodiments. In some embodiments, the insulating layer 118 is made of a photosensitive material and may undergo chemical reactions when exposed to light.

In some embodiments, the barrier layer 117 and the insulating layer 118 are made of different materials. The insulating layer 118 is formed using a coating process, a lamination process, a chemical vapor deposition process, the like, or a combination thereof, in accordance with some embodiments. The openings 118a and 118b are formed using a photolithography process and an etching process, in accordance with some embodiments.

Thereafter, as shown in FIG. 1E, a seed layer 162 is formed over the barrier layer 117, the insulating layer 118, and the conductive via structures 112, in accordance with some embodiments. The seed layer 162 conformally covers the barrier layer 117 and the insulating layer 118 and the conductive via structures 112, in accordance with some embodiments.

The seed layer 162 is in direct contact with the barrier layer 117 and the insulating layer 118 and the conductive via structures 112, in accordance with some embodiments. The materials of the seed layer 162 include titanium, copper, or the like, in accordance with some embodiments. The seed layer 162 is formed using a physical vapor deposition (PVD) process such as a sputtering process, in accordance with some embodiments.

Thereafter, as shown in FIGS. 1E and 1E-1, a mask layer 164 is formed over the seed layer 162, in accordance with some embodiments. The mask layer 164 has openings 164a, in accordance with some embodiments. Each opening 164a exposes a portion of the seed layer 162 in the openings 117a, 118a, and 118b, in accordance with some embodiments. The mask layer 164 is made of a polymer material such as a photoresist material, in accordance with some embodiments.

Thereafter, as shown in FIGS. 1E and 1E-1, conductive layers 166 are formed in the openings 164a, in accordance with some embodiments. The conductive layers 166 conformally cover the seed layer 162 exposed by the openings 164a, in accordance with some embodiments. The conductive layer 166 is thicker than the seed layer 162, in accordance with some embodiments. Each conductive layer 166 is partially in the openings 117a, 118a, and 118b thereunder, in accordance with some embodiments.

The conductive layer 166 is made of a metal material such as copper, aluminum, nickel, tungsten, titanium, the like, or a combination thereof, in accordance with some embodiments. The conductive layer 166 is formed using an electroplating process, an electroless plating process, or the like, in accordance with some embodiments.

Figure 1F:
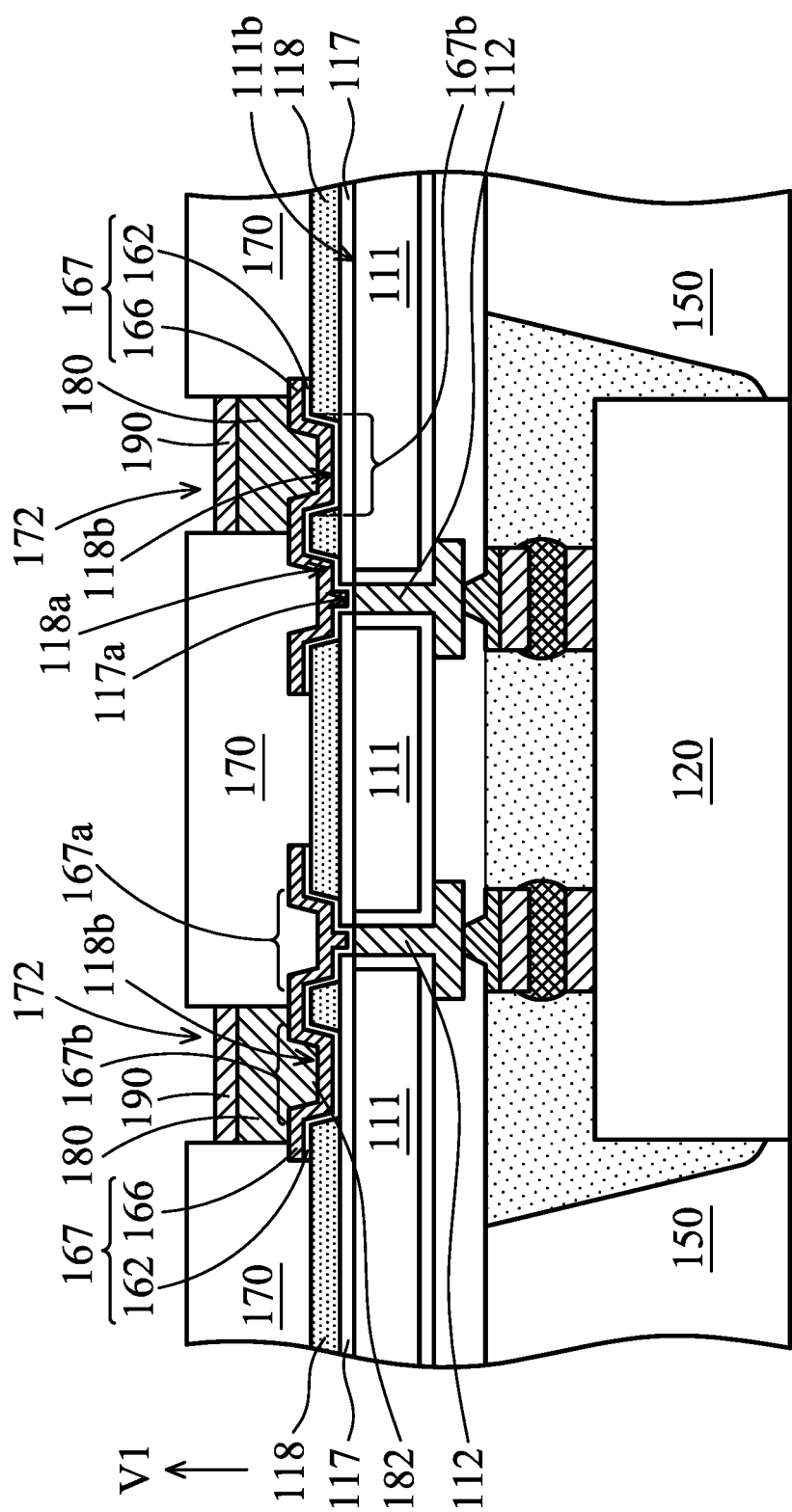

Thereafter, as shown in FIGS. 1E and 1F, the mask layer 164 is removed, in accordance with some embodiments. The removal process includes an ash process and/or a flush process, in accordance with some embodiments. Thereafter, as shown in FIG. 1F, the seed layer 162 originally under the mask layer 164 is removed, in accordance with some embodiments. The removal process includes an etching process such as a wet etching process or a dry etching process, in accordance with some embodiments.

As shown in FIG. 1F, after the seed layer 162 originally under the mask layer 164 is removed, each conductive layer 166 and the seed layer 162 remaining under the conductive layer 166 together form a conductive pad 167, in accordance with some embodiments. Each conductive pad 167 continuously extends from the conductive via structure 112 (or the opening 117a) thereunder into the opening 118b thereunder, in accordance with some embodiments. As shown in FIG. 1F, the conductive pad 167 has a W-like shape, in accordance with some embodiments.

Each conductive pad 167 has a first portion 167a and a second portion 167b, in accordance with some embodiments. The first portion 167a passes through the barrier layer 117 and the insulating layer 118 to connect with the conductive via structure 112 thereunder, in accordance with some embodiments. The second portion 167b passes through the insulating layer 118, in accordance with some embodiments.

The second portion 167b is in direct contact with the barrier layer 117, in accordance with some embodiments. The insulating layer 118 is partially between the first portion 167a and the second portion 167b, in accordance with some embodiments. The insulating layer 118 separates the first portion 167a from the second portion 167b, in accordance with some embodiments.

Thereafter, as shown in FIG. 1F, a mask layer 170 is formed over the conductive pads 167 and the insulating layer 118, in accordance with some embodiments. The mask layer 170 is in direct contact with the conductive pads 167 and the insulating layer 118, in accordance with some embodiments.

The mask layer 170 has openings 172 formed using suitable lithography and etching processes, in accordance with some embodiments. Each opening 172 partially exposes the conductive pad 167 (or the conductive layer 166) in the opening 118b, in accordance with some embodiments. The mask layer 170 is made of a polymer material such as a photoresist material, in accordance with some embodiments.

Thereafter, as shown in FIG. 1F, conductive bumps 180 are respectively formed in the openings 172, in accordance with some embodiments. The conductive bump 180 is directly over the opening 118b, in accordance with some embodiments. The conductive bump 180 is directly over the second portion 167b of the conductive pad 167, in accordance with some embodiments. That is, there is no seed layer between the conductive bump 180 and the conductive pad 167 (or the conductive layer 166), in accordance with some embodiments. The conductive bump 180 is electrically connected to the conductive via structures 112 through the conductive pad 167 thereunder, in accordance with some embodiments.

The conductive bump 180 is thicker than the conductive pad 167, in accordance with some embodiments. The conductive bump 180 is in direct contact with the conductive pad 167 (or the conductive layer 166), in accordance with some embodiments. In some embodiments, a bottom portion 182 of the conductive bump 180 is in the opening 118b.

The conductive bump 180 and the conductive via structure 112 are misaligned in a vertical direction V1 perpendicular to the surface 111b, in accordance with some embodiments. Therefore, during subsequent bonding processes, the bonding stress concentrated on the conductive bump 180 is not conducted to the conductive via structure 112, in accordance with some embodiments. As a result, the conductive via structure 112 is prevented from being damaged by the bonding stress, in accordance with some embodiments.

The conductive bumps 180 are made of a conductive material such as copper (Cu), aluminum (Al), tungsten (W), cobalt (Co), or nickel (Ni), in accordance with some embodiments. The conductive bumps include controlled collapse chip connector (C4) copper pillar bumps, in accordance with some embodiments. The conductive bumps 180 are formed using a plating process such as an electroplating process, in accordance with some embodiments.

Thereafter, as shown in FIG. 1F, solder layers 190 are respectively formed over the conductive bumps 180, in accordance with some embodiments. The solder layers 190 are made of tin (Sn), lead-free solder or another suitable conductive material with a melting point lower than that of the conductive bumps 180, in accordance with some embodiments. The solder layers 190 are formed using a plating process such as an electroplating process, in accordance with some embodiments.

Figure 1G:
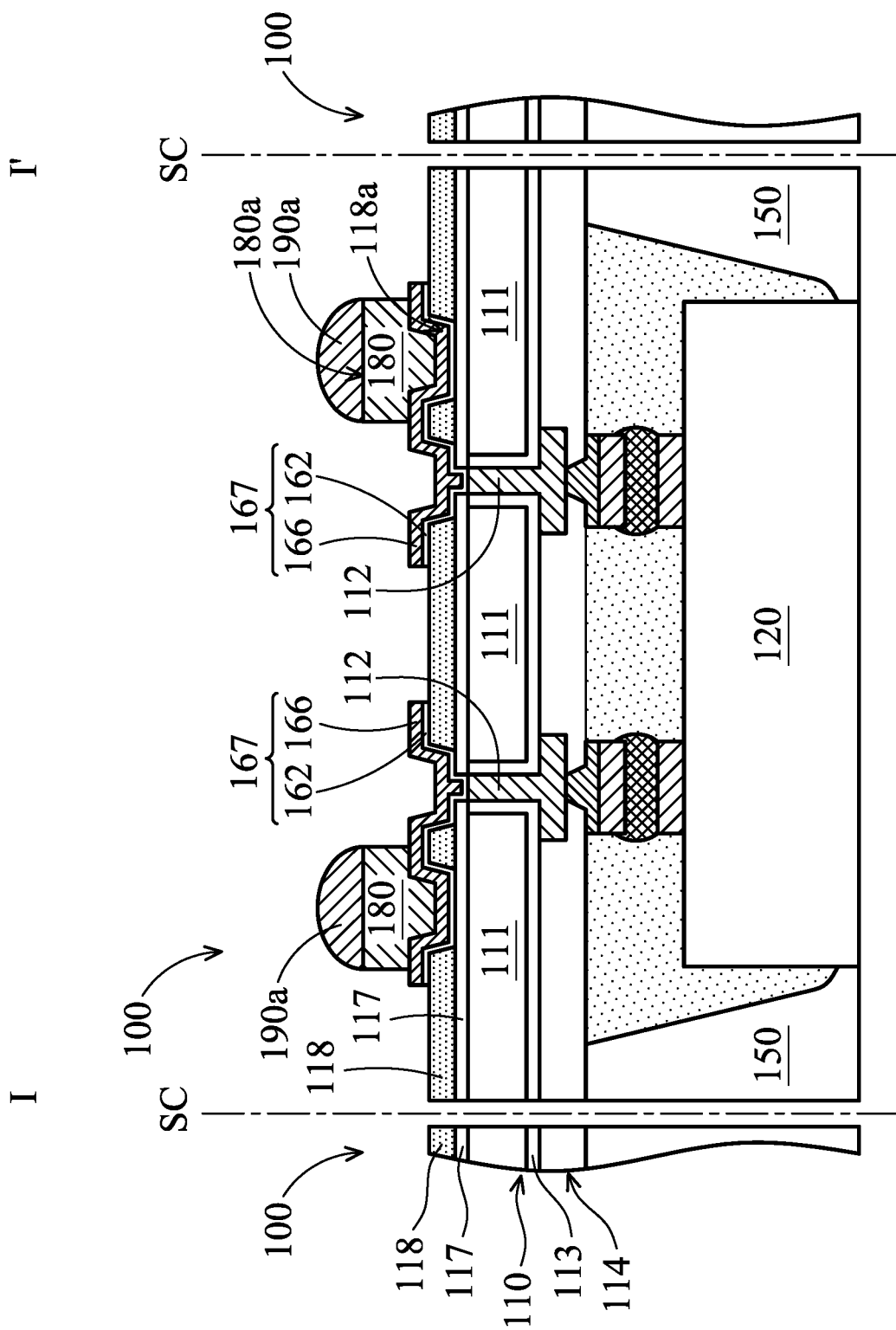
Figures 1, 1G:
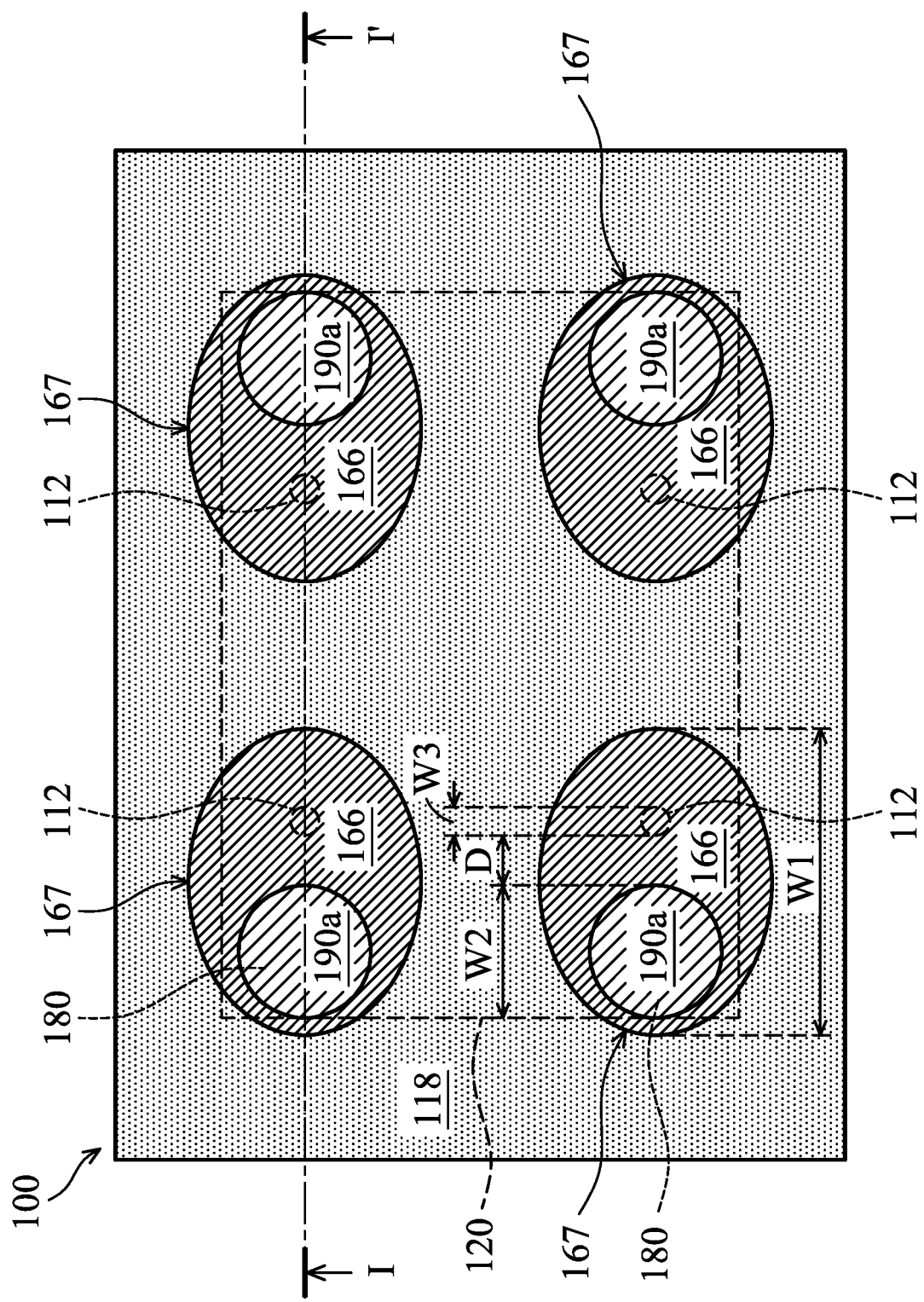

FIG. 1G-1 is a top view of the chip package structure of FIG. 1G, in accordance with some embodiments. FIG. 1G is a cross-sectional view illustrating the chip package structure 100 along a sectional line I-I' in FIG. 1G-1, in accordance with some embodiments. As shown in FIGS. 1G and 1G-1, the mask layer 170 is removed, in accordance with some embodiments. The removal process includes an ash process and/or a flush process, in accordance with some embodiments.

Thereafter, as shown in FIGS. 1F and 1G, a reflow process is performed over the solder layers 190 to convert the solder layers 190 into solder balls 190a, in accordance with some embodiments. As shown in FIG. 1G, a cutting process is performed to cut through the substrate 110 and the molding layer 150 along predetermined scribe lines SC to form chip package structures 100, in accordance with some embodiments. For the sake of simplicity, FIG. 1G-1 only shows one of the chip package structures 100.

As shown in FIG. 1G, a contact area between the conductive bump 180 and the conductive pad 167 is greater than an area of a top surface 180a of the conductive bump 180, in accordance with some embodiments. As shown in FIG. 1G-1, a width W1 of the conductive pad 167 is greater than a sum of a width W2 of the conductive bump 180, a width W3 of the conductive via structure 112, and a distance D between the conductive bump 180 and the conductive via structure 112, in accordance with some embodiments.

Figure 1H:
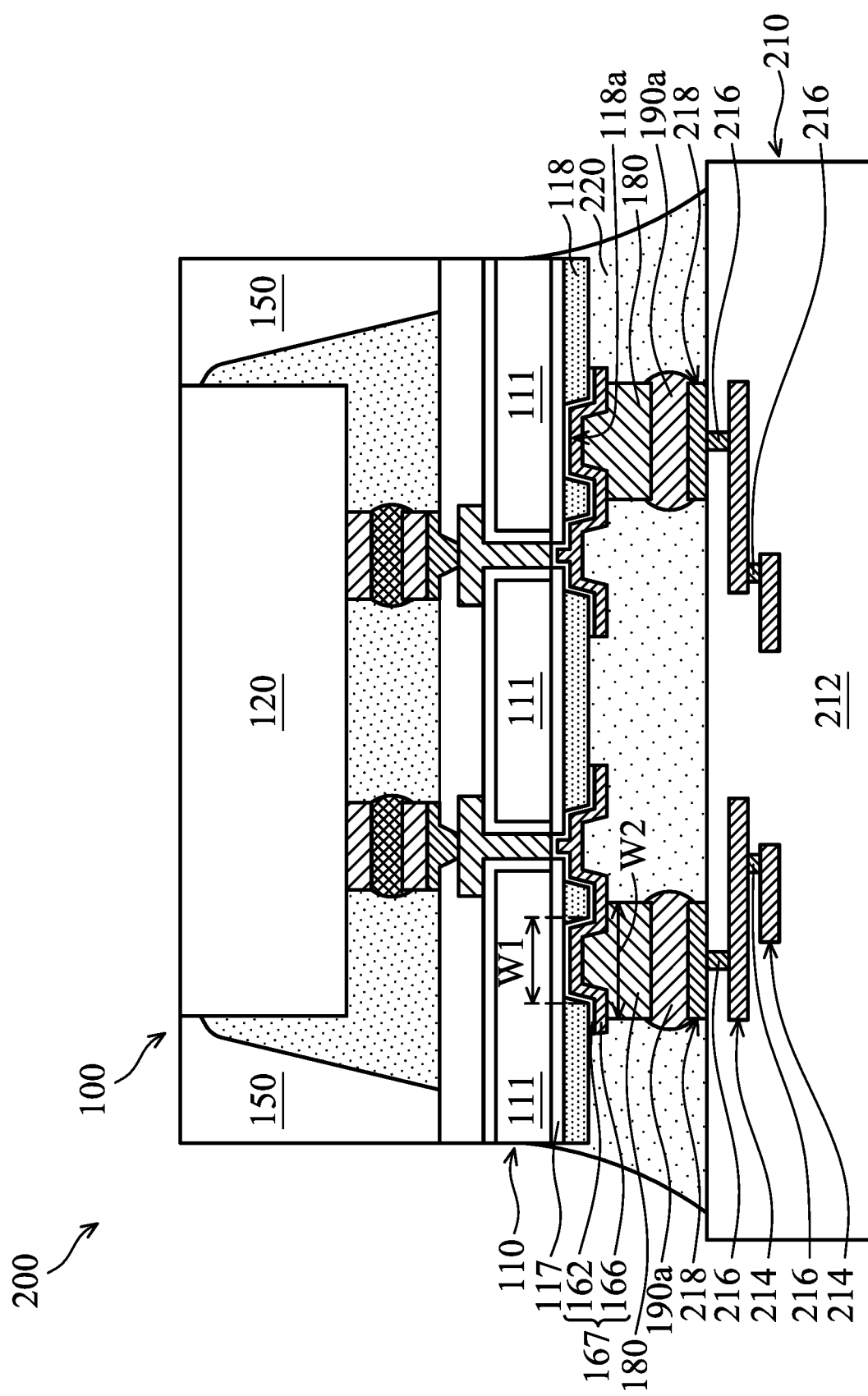

As shown in FIG. 1H, the chip package structure 100 is flipped upside down, in accordance with some embodiments. As shown in FIG. 1H, the chip package structure 100 is bonded to a substrate 210 through the solder balls 190a, in accordance with some embodiments.

During the bonding process, the bonding stress between the chip package structure 100 and the substrate 210 tends to concentrate on the conductive bumps 180, in accordance with some embodiments. If the conductive pad 167 under the conductive bumps 180 is entirely separated from the barrier layer 117 by the insulating layer 118, the bonding stress concentrated on the conductive bumps 180 may be conducted to the insulating layer 118 and may damage the insulating layer 118, which may lower the yield of the bonding process.

Since the conductive pads 167 under the conductive bumps 180 are in direct contact with the barrier layer 117, the bonding stress concentrated on the conductive bumps 180 is directly conducted to the barrier layer 117 and the semiconductor substrate 111, in accordance with some embodiments. Therefore, the insulating layer 118 is prevented from being damaged by the bonding stress concentrated on the conductive bumps 180, in accordance with some embodiments. Since the barrier layer 117 is harder and thinner than the insulating layer 118, the barrier layer 117 is able to withstand the bonding stress concentrated on the conductive bumps 180, in accordance with some embodiments. As a result, the yield of the bonding process is improved, in accordance with some embodiments.

Furthermore, since the conductive bumps 180 are formed over the conductive pads 167 passing through the insulating layer 118, the coplanarity of the conductive bumps 180 are not affected by the coplanarity of the insulating layer 118, in accordance with some embodiments. Therefore, the coplanarity of the conductive bumps 180 are improved, in accordance with some embodiments. As a result, the yield of the bonding process is improved, in accordance with some embodiments.

In some embodiments, a ratio of a width W1 of the opening 118a to a width W2 of the conductive bump 180 ranges from about 0.3 to about 1. In some embodiments, the ratio of the width W1 of the opening 118a to the width W2 of the conductive bump 180 ranges from about 0.3 to about 0.8. If the ratio of the width W1 of the opening 118a to the width W2 of the conductive bump 180 is less than 0.3, the yield of the bonding process is slightly improved or not improved.

The substrate 210 includes an insulating layer 212, wiring layers 214, conductive vias 216, and pads 218, in accordance with some embodiments. The wiring layers 214 are formed in the insulating layer 212, in accordance with some embodiments. The conductive pads 218 are formed over the insulating layer 212, in accordance with some embodiments. The conductive vias 216 are electrically connected between different wiring layers 214 and between the wiring layers 214 and the conductive pads 218, in accordance with some embodiments.

As shown in FIG. 1H, an underfill layer 220 is formed between the substrates 110 and 210, in accordance with some embodiments. In some embodiments, a portion of the underfill layer 220 is formed over the substrate 210 and surrounds the chip package structure 100. The underfill layer 220 is made of an insulating material, such as a polymer material, in accordance with some embodiments. In this step, a chip package structure 200 is substantially formed, in accordance with some embodiments.

Figure 2:
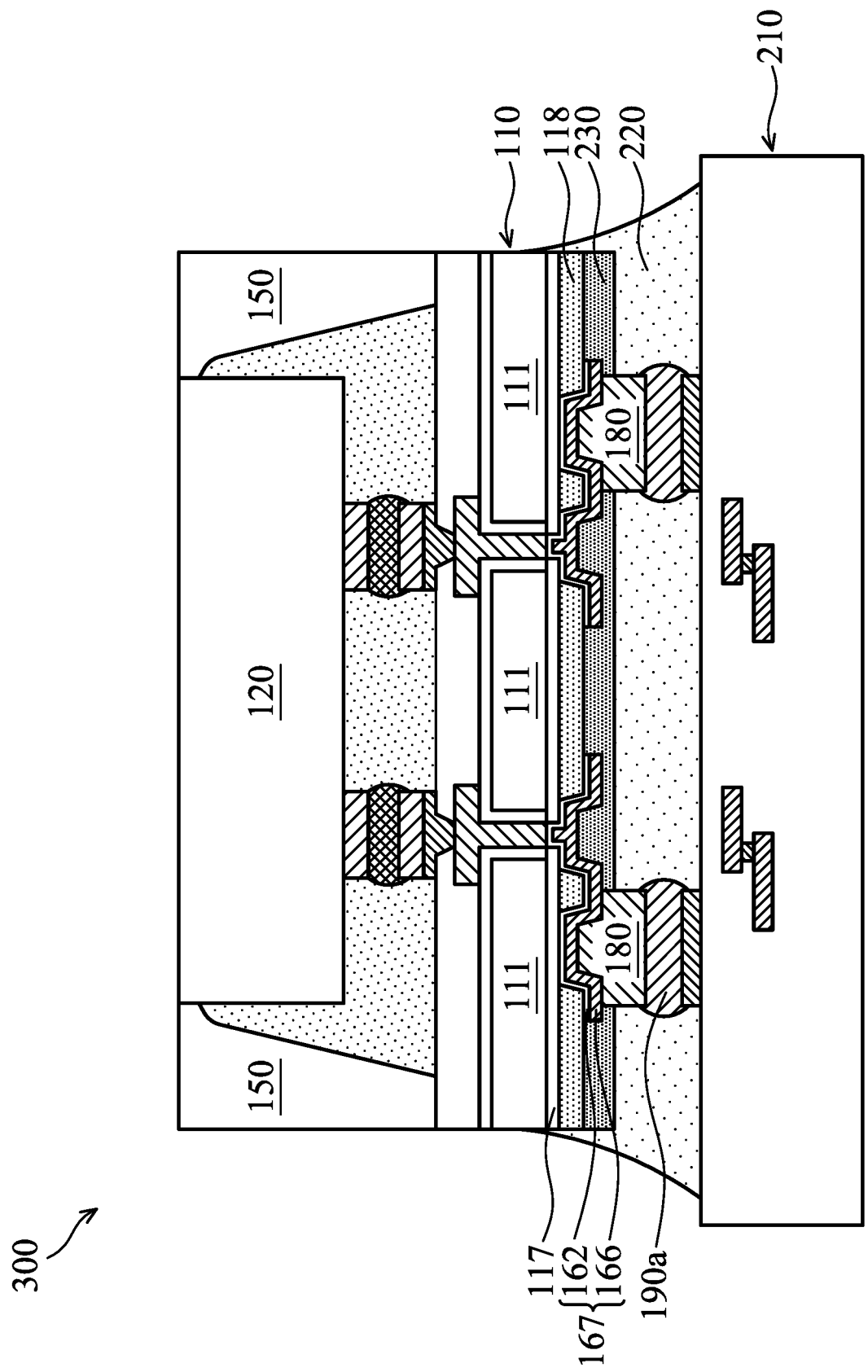
FIG. 2 is a cross-sectional view illustrating a chip package structure, in accordance with some embodiments.

FIG. 2 is a cross-sectional view illustrating a chip package structure, in accordance with some embodiments. As shown in FIG. 2, after the step of FIG. 1F, the mask layer 170 is removed, and then an insulating layer 230 is formed over the insulating layer 118 and the conductive pads 167, in accordance with some embodiments.

The insulating layer 230 covers portions of the conductive pads 167, which are not covered by the conductive bumps 180, in accordance with some embodiments. That is, the insulating layer 230 dose not vertically overlap with the conductive bumps 180, in accordance with some embodiments. The insulating layer 230 surrounds the conductive bumps 180, in accordance with some embodiments.

The insulating layer 230 is made of a polymer material such as epoxy, polyimide, polybenzoxazole (PBO), solder resist (SR), and the like, in accordance with some embodiments. In some embodiments, the insulating layer 230 is made of a photosensitive material and may undergo chemical reactions when exposed to light.

In some embodiments, the barrier layer 117 and the insulating layer 230 are made of different materials. The insulating layer 230 is formed using a dispensing process, a coating process, the like, or a combination thereof, in accordance with some embodiments. As shown in FIG. 2, the steps of FIGS. 1G-1H are performed to form a chip package structure 300, in accordance with some embodiments.

Figure 3A:
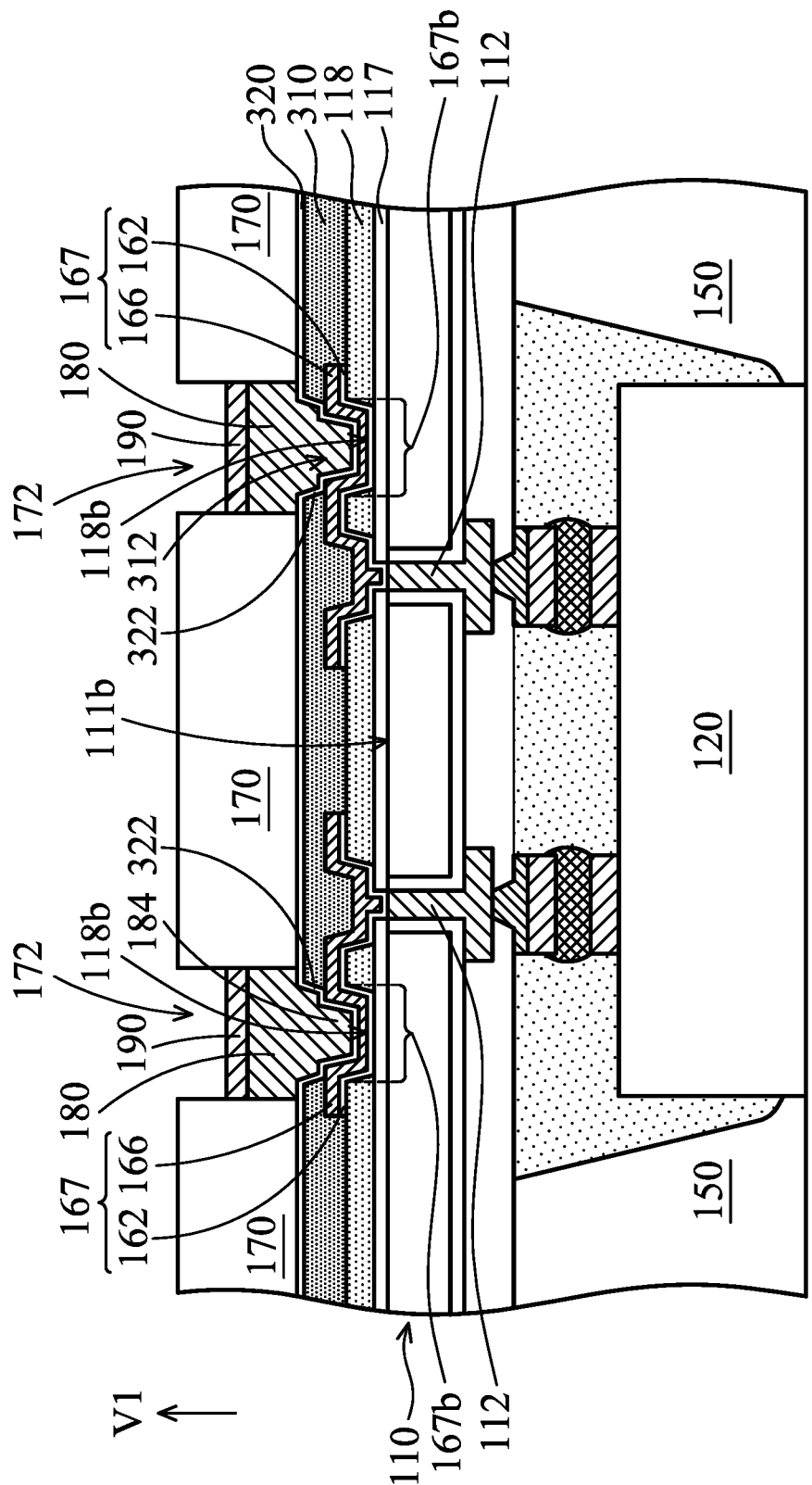
FIGS. 3A-3C are cross-sectional views of various stages of a process for forming a chip package structure, in accordance with some embodiments.
Figure 3B:
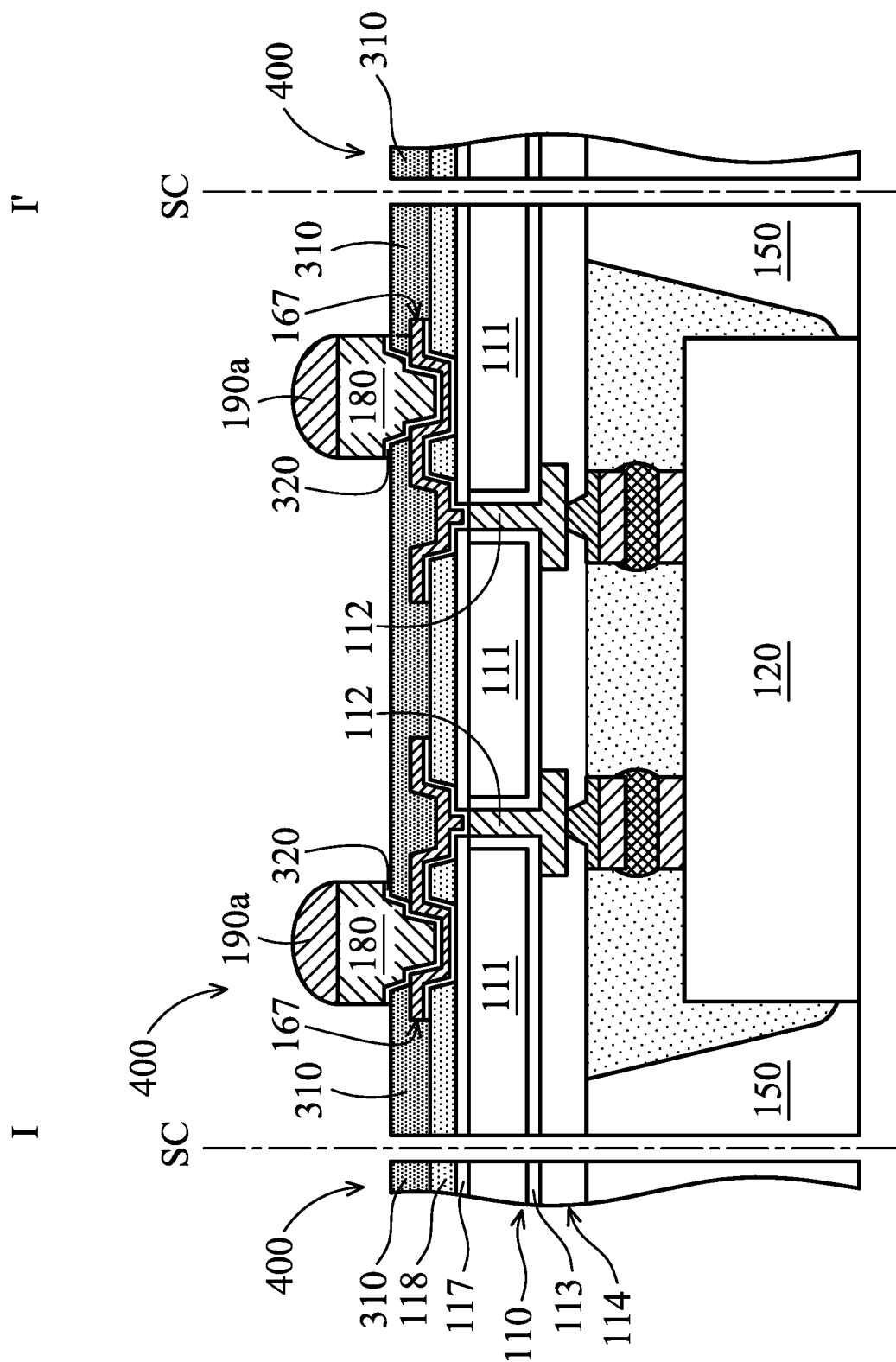
Figure 3C:
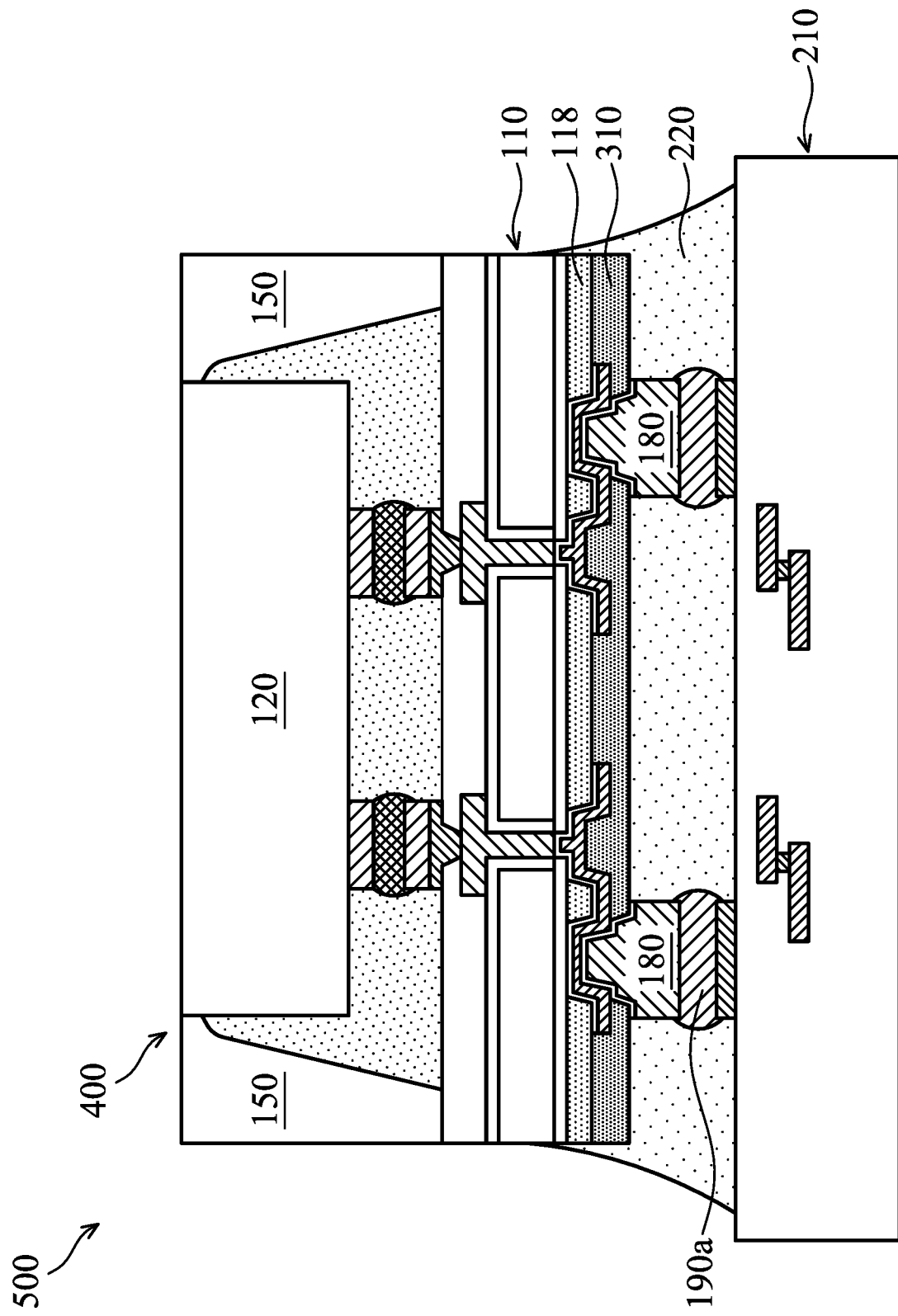

FIGS. 3A-3C are cross-sectional views of various stages of a process for forming a chip package structure, in accordance with some embodiments. As shown in FIG. 3A, after the step of FIG. 1E, the mask layer 164 is removed, and then an insulating layer 310 is formed over the insulating layer 118 and the conductive pads 167, in accordance with some embodiments. The insulating layer 310 has openings 312, in accordance with some embodiments. The openings 312 expose the conductive pads 167 in the openings 118b of the insulating layer 118, in accordance with some embodiments.

The insulating layer 310 is made of a polymer material such as epoxy, polyimide, polybenzoxazole (PBO), solder resist (SR), and the like, in accordance with some embodiments. In some embodiments, the insulating layer 310 is made of a photosensitive material and may undergo chemical reactions when exposed to light. In some embodiments, the barrier layer 117 and the insulating layer 310 are made of different materials.

The insulating layer 310 is formed using a coating process, a lamination process, a chemical vapor deposition process, the like, or a combination thereof, in accordance with some embodiments. The openings 312 are formed using a photolithography process and an etching process, in accordance with some embodiments.

As shown in FIG. 3A, a seed layer 320 is formed over the insulating layer 310 and the conductive pads 167, in accordance with some embodiments. In some embodiments, bottom portions 322 of the seed layer 320 pass through the insulating layer 310 to conformally cover the second portions 167b of the conductive pads 167.

The bottom portions 322 of the seed layer 320 are partially in the insulating layer 118, in accordance with some embodiments. The seed layer 320 is made of titanium, copper, or the like, in accordance with some embodiments. The materials of the seed layer 320 may include other metals, such as silver, gold, aluminum, and combinations thereof.

Thereafter, as shown in FIG. 3A, a mask layer 170 is formed over the seed layer 320, in accordance with some embodiments. The mask layer 170 is in direct contact with the seed layer 320, in accordance with some embodiments. The mask layer 170 has openings 172, in accordance with some embodiments. The openings 172 partially expose the seed layer 320, in accordance with some embodiments. The mask layer 170 is made of a polymer material such as a photoresist material, in accordance with some embodiments.

Thereafter, as shown in FIG. 3A, conductive bumps 180 are respectively formed in the openings 172, in accordance with some embodiments. The conductive bump 180 is in direct contact with the seed layer 320, in accordance with some embodiments. The conductive bump 180 is directly over the opening 118b, in accordance with some embodiments. The conductive bump 180 is directly over the second portion 167b of the conductive pad 167, in accordance with some embodiments.

The conductive bump 180 and the conductive via structure 112 are misaligned in a vertical direction V1 perpendicular to the surface 111b, in accordance with some embodiments. In some embodiments, a bottom portion 184 of the conductive bump 180 passes through the insulating layer 310. The insulating layer 310 is partially between the conductive bump 180 and the conductive pad 167, in accordance with some embodiments.

The conductive bumps 180 are made of a conductive material such as copper (Cu), aluminum (Al), tungsten (W), cobalt (Co), or nickel (Ni), in accordance with some embodiments. The conductive bumps 180 are formed using a plating process such as an electroplating process, in accordance with some embodiments.

Thereafter, as shown in FIG. 3A, solder layers 190 are respectively formed over the conductive bumps 180, in accordance with some embodiments. The solder layers 190 are made of tin (Sn), lead-free solder or another suitable conductive material with a melting point lower than that of the conductive bumps 180, in accordance with some embodiments. The solder layers 190 are formed using a plating process such as an electroplating process, in accordance with some embodiments.

As shown in FIG. 3B, the mask layer 170 is removed, in accordance with some embodiments. The removal process includes an ash process and/or a flush process, in accordance with some embodiments. Thereafter, as shown in FIG. 3B, the seed layer 320 originally under the mask layer 170 is removed, in accordance with some embodiments. The removal process includes an etching process such as a wet etching process or a dry etching process, in accordance with some embodiments.

Thereafter, as shown in FIG. 3B, a reflow process is performed over the solder layers 190 to convert the solder layers 190 into solder balls 190a, in accordance with some embodiments. As shown in FIG. 3B, a cutting process is performed to cut through the insulating layer 310, the substrate 110 and the molding layer 150 along predetermined scribe lines SC to form chip package structures 400, in accordance with some embodiments.

The conductive bump 180 is electrically connected to the conductive via structures 112 through the seed layer 320 and the conductive pad 167 thereunder, in accordance with some embodiments. As shown in FIG. 3C, the step of FIG. 1H is performed to form a chip package structure 500, in accordance with some embodiments.

Figure 4A:
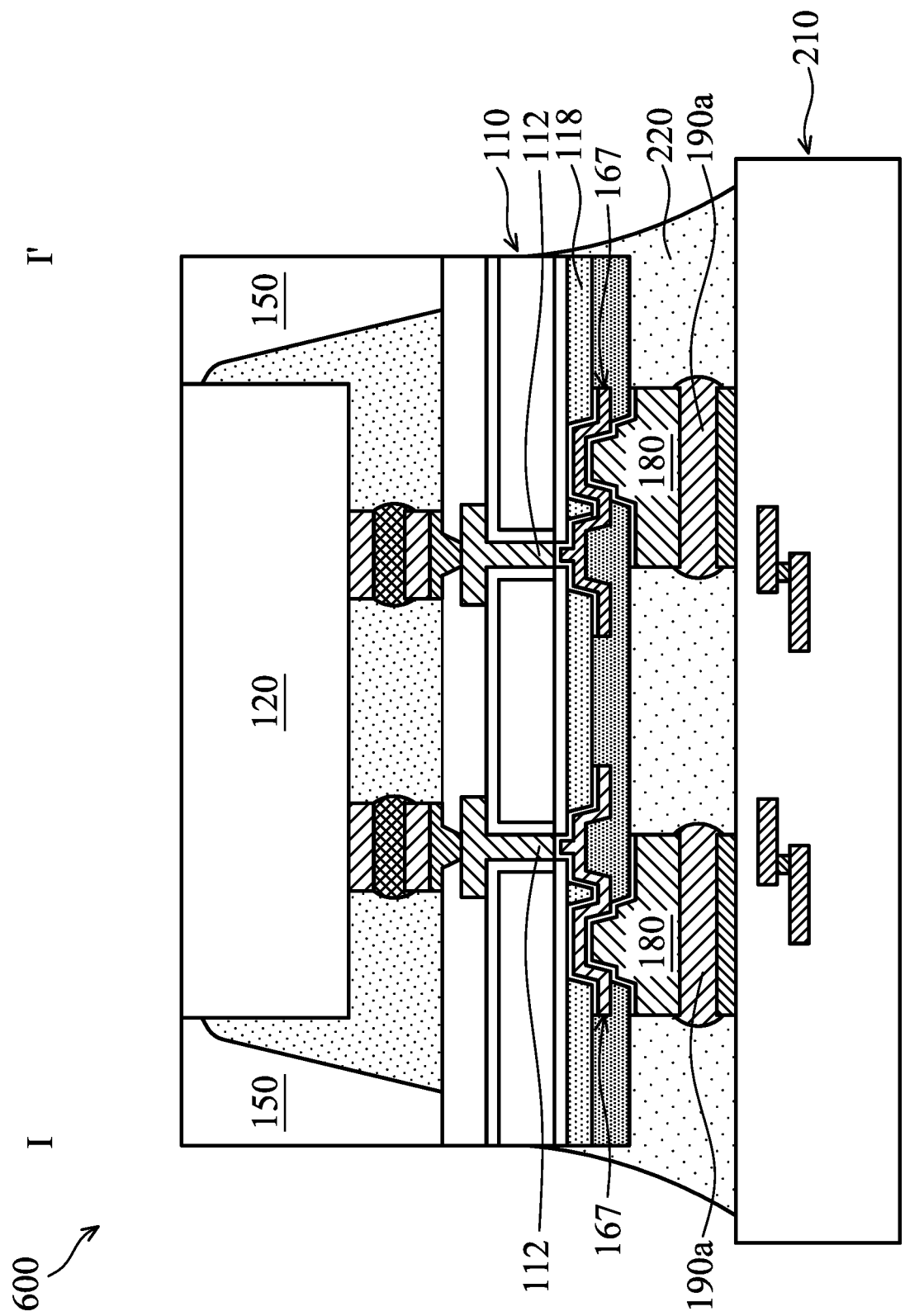
FIG. 4A is a cross-sectional view illustrating a chip package structure, in accordance with some embodiments.
Figure 4B:
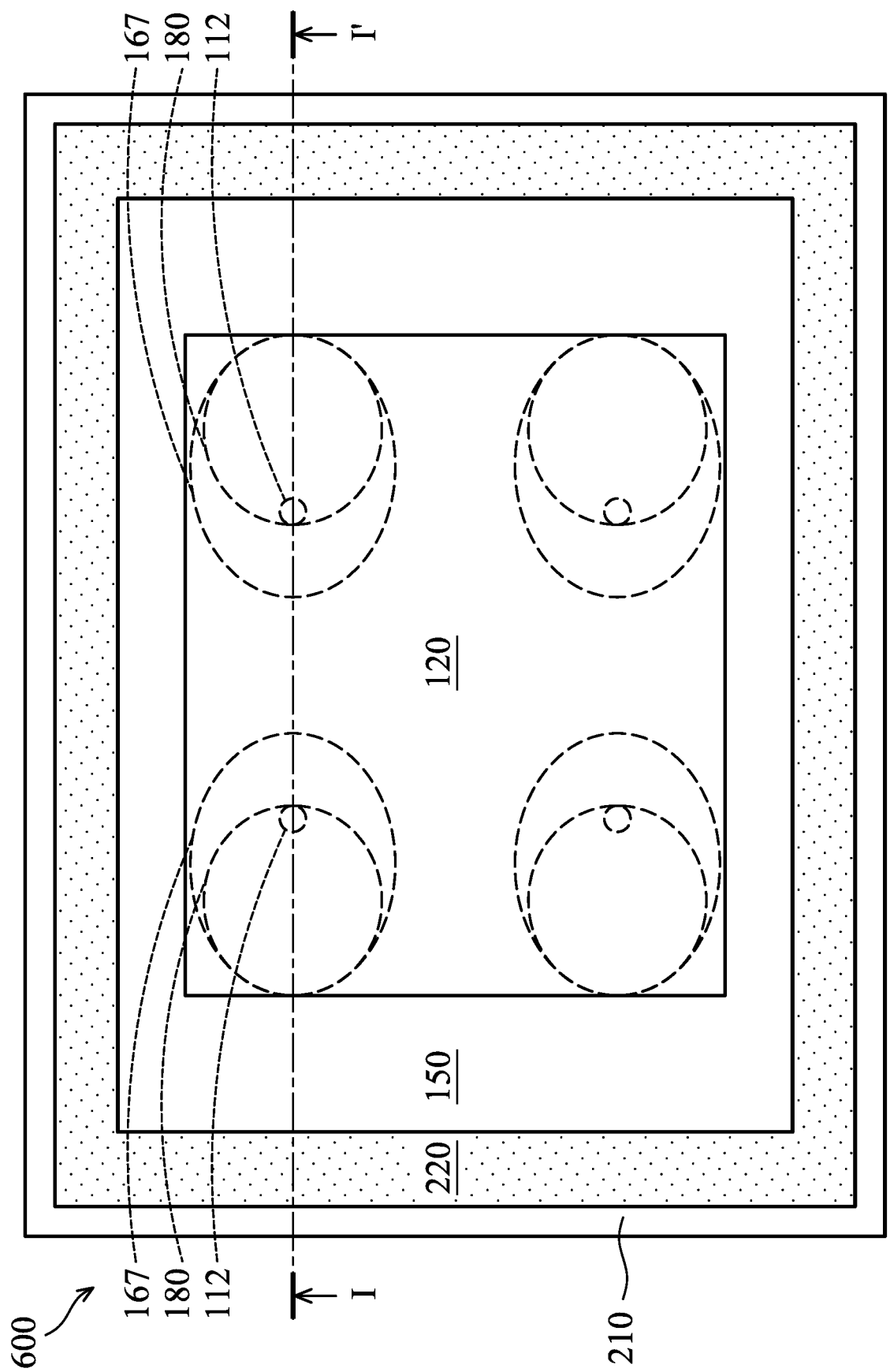
FIG. 4B is a top view of the chip package structure of FIG. 4A, in accordance with some embodiments.

FIG. 4A is a cross-sectional view illustrating a chip package structure 600, in accordance with some embodiments. FIG. 4B is a top view of the chip package structure 600 of FIG. 4A, in accordance with some embodiments. FIG. 4A is a cross-sectional view illustrating the chip package structure 600 along a sectional line I-I' in FIG. 4B, in accordance with some embodiments.

As shown in FIGS. 4A and 4B, the chip package structure 600 is similar to the chip package structure 500 of FIG. 3C, except that the conductive bumps 180 vertically overlap the conductive via structures 112, in accordance with some embodiments.

Processes and materials for forming the chip package structures 300, 500 and 600 may be similar to, or the same as, those for forming the chip package structure 200 described above.

In accordance with some embodiments, chip package structures and methods for forming the same are provided. The methods (for forming the chip package structure) includes: sequentially forming a barrier layer and a insulating layer over a substrate; forming a conductive pad over the insulating layer, wherein the conductive pad has a first portion and a second portion, the first portion passes through the barrier layer and the second insulating to connect with a conductive via structure in the substrate, and the second portion passes through the insulating layer; and forming a conductive bump over the second portion. While bonding the substrate to another substrate through the conductive bump, the bonding stress tends to concentrate on the conductive bump. Since the second portion passes through the insulating layer, the bonding stress concentrated on the conductive bump is directly conducted to the barrier layer and the substrate, not conducted to the insulating layer. Therefore, the insulating layer is protected from damage due to bonding stress. As a result, the yield of the bonding process is improved.

In accordance with some embodiments, a chip package structure is provided. The chip package structure includes a first substrate. The chip package structure includes a conductive via structure passing through the first substrate. The chip package structure includes a barrier layer over a surface of the first substrate. The chip package structure includes an insulating layer over the barrier layer. The chip package structure includes a conductive pad over the insulating layer. The conductive pad has a first portion passing through the insulating layer and the barrier layer and connected to the conductive via structure. The chip package structure includes a conductive bump over the conductive pad. The chip package structure includes a second substrate. The first substrate is bonded to the second substrate through the conductive bump. The chip package structure includes an underfill layer between the first substrate and the second substrate. A second portion of the underfill layer extends into the first portion of the conductive pad.

In accordance with some embodiments, a chip package structure is provided. The chip package structure includes a first substrate. The chip package structure includes a conductive via structure passing through the first substrate. The chip package structure includes a barrier layer over a surface of the first substrate. The chip package structure includes an insulating layer over the barrier layer. The chip package structure includes a conductive pad over the insulating layer. The conductive pad has a portion embedded in the barrier layer and the insulating layer. The chip package structure includes a conductive bump over the conductive pad. The chip package structure includes a second substrate. The first substrate is bonded to the second substrate through the conductive bump. The chip package structure includes an underfill layer between the first substrate and the second substrate and surrounding the conductive bump. The portion of the conductive pad is between and in direct contact with the underfill layer and the conductive via structure.

In accordance with some embodiments, a chip package structure is provided. The chip package structure includes a first substrate. The chip package structure includes a conductive via structure passing through the first substrate. The chip package structure includes a barrier layer over a surface of the first substrate. The chip package structure includes a first insulating layer over the barrier layer. The chip package structure includes a conductive pad over the first insulating layer. The conductive pad has a first portion embedded in the barrier layer and the first insulating layer. The chip package structure includes a second insulating layer over the first insulating layer and the conductive pad. The second insulating layer has a second portion embedded in the first portion of the conductive pad. The chip package structure includes a conductive bump over and passing through the second insulating layer and connected to conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first substrate;
a conductive via structure passing through the first substrate;
a barrier layer over a surface of the first substrate;
an insulating layer over the barrier layer;
a conductive pad over the insulating layer, wherein the conductive pad has a first portion passing through the insulating layer and the barrier layer and connected to the conductive via structure;
a conductive bump over the conductive pad;
a second substrate, wherein the first substrate is bonded to the second substrate through the conductive bump; and
an underfill layer between the first substrate and the second substrate, wherein a second portion of the underfill layer extends into the first portion of the conductive pad.

2. The package structure as claimed in claim 1, wherein the second portion of the underfill layer extends towards the conductive via structure.

3. The package structure as claimed in claim 1, wherein the conductive pad has a third portion passing through the insulating layer, the barrier layer separates the third portion from the first substrate, and the conductive bump extends into the third portion.

4. The package structure as claimed in claim 3, wherein the first portion of the conductive pad is closer to the first substrate than the third portion of the conductive pad.

5. The package structure as claimed in claim 3, wherein the third portion of the conductive pad has a first U-like shape.

6. The package structure as claimed in claim 5, wherein the first portion of the conductive pad has a second U-like shape.

7. The package structure as claimed in claim 1, wherein the underfill layer is in direct contact with the insulating layer, the first portion of the conductive pad, the conductive bump, and the second substrate.

8. The package structure as claimed in claim 1, wherein the conductive bump and the conductive via structure are misaligned in a vertical direction perpendicular to the surface of the first substrate.

9. The package structure as claimed in claim 1, further comprising:
a solder ball between the conductive bump and the second substrate, wherein the underfill layer surrounds the solder ball.

10. The package structure as claimed in claim 1, wherein the underfill layer between the conductive via structure and the second substrate is thicker than the underfill layer not between the conductive via structure and the second substrate.

11. A package structure, comprising:
a first substrate;
a conductive via structure passing through the first substrate;
a barrier layer over a surface of the first substrate;
an insulating layer over the barrier layer;
a conductive pad over the insulating layer, wherein the conductive pad has a portion embedded in the barrier layer and the insulating layer;
a conductive bump over the conductive pad;
a second substrate, wherein the first substrate is bonded to the second substrate through the conductive bump; and
an underfill layer between the first substrate and the second substrate and surrounding the conductive bump, wherein the portion of the conductive pad is between and in direct contact with the underfill layer and the conductive via structure.

12. The package structure as claimed in claim 11, wherein the portion of the conductive pad has a U-like shape.

13. The package structure as claimed in claim 11, wherein the conductive bump is spaced apart from the portion of the conductive pad.

14. The package structure as claimed in claim 11, wherein the conductive bump is spaced apart from the conductive via structure in a top view of the conductive bump and the conductive via structure.

15. The package structure as claimed in claim 11, wherein the conductive pad is in direct contact with the barrier layer.

16. A package structure, comprising:
a first substrate;
a conductive via structure passing through the first substrate;
a barrier layer over a surface of the first substrate;
a first insulating layer over the barrier layer;
a conductive pad over the first insulating layer, wherein the conductive pad has a first portion embedded in the barrier layer and the first insulating layer;

a second insulating layer over the first insulating layer and the conductive pad, wherein the second insulating layer has a second portion embedded in the first portion of the conductive pad; and a conductive bump over and passing through the second insulating layer and connected to the conductive pad, wherein the conductive bump extends into the first insulating layer.

17. The package structure as claimed in claim 16, wherein the second insulating layer is in direct contact with the first insulating layer, the conductive pad, and the conductive bump.

18. The package structure as claimed in claim 16, wherein the conductive bump and the conductive via structure are misaligned in a vertical direction perpendicular to the surface of the first substrate.

19. The package structure as claimed in claim 16, wherein the second insulating layer is partially between the first portion of the conductive pad and the conductive bump.

20. The package structure as claimed in claim 16, wherein the second insulating layer between the conductive via structure and the second substrate is thicker than the second insulating layer not between the conductive via structure and the second substrate.

* * * * *